(12) United States Patent
Lester

(10) Patent No.: US 7,095,052 B2
(45) Date of Patent: Aug. 22, 2006

(54) METHOD AND STRUCTURE FOR IMPROVED LED LIGHT OUTPUT

(75) Inventor: Steven D. Lester, Palo Alto, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/971,380

(22) Filed: Oct. 22, 2004

(65) Prior Publication Data

US 2006/0097269 A1 May 11, 2006

(51) Int. Cl.
 *H01L 27/15* (2006.01)
(52) U.S. Cl. ............................ 257/79; 257/88; 257/89; 257/90; 257/94
(58) Field of Classification Search ................ None
 See application file for complete search history.

(56) References Cited

U.S. PATENT DOCUMENTS

| | | | | |
|---|---|---|---|---|
| 6,163,038 | A * | 12/2000 | Chen et al. ................. | 257/103 |
| 2001/0017874 | A1* | 8/2001 | Ishida ........................ | 372/45 |
| 2001/0043629 | A1* | 11/2001 | Sun et al. ................... | 372/43 |
| 2003/0197169 | A1* | 10/2003 | Lee et al. ................... | 257/14 |
| 2004/0144990 | A1* | 7/2004 | Udagawa ................... | 257/103 |

* cited by examiner

*Primary Examiner*—David Nelms
*Assistant Examiner*—Hoang-Quan Ho

(57) ABSTRACT

The efficiency of LEDs is increased by incorporating multiple active in series separated by tunnel junction diodes. This also allows the LEDs to operate at longer wavelengths.

20 Claims, 4 Drawing Sheets

METHOD AND STRUCTURE FOR IMPROVED LED LIGHT OUTPUT

BACKGROUND OF THE INVENTION

The operating efficiency of light emitting diodes (LEDs) may be improved in a number of ways. These include improvements in the quality of the semiconductor layers and the design of the structure to maximize coupling of light out of the LED.

The operating efficiency of LEDs based on AlGaInN or InGaN decreases as the net drive current is increased as is shown in graph 110 of FIG. 1 for a green GaInN LED. This effect exists in addition to the well-known effect in LEDs where efficiency decreases due to heating brought on by increases in the drive current. The effect limits the performance of AlGaInN or InGaN at high drive currents. Additionally, for AlGaInN or InGaN LEDs, a wavelength shift to shorter wavelengths occurs as the current increases.

BRIEF SUMMARY OF THE INVENTION

In accordance with the invention multiple active regions in series separated by tunnel junctions are incorporated into AlGaInN or InGaN LEDs. For a fixed input power, LEDs in accordance with the invention require higher drive voltages but the current and current densities are reduced by a factor of n, where n is the number of active regions. The ability to operate at a lower drive current improves the efficiency of the AlGaInN or InGaN LEDs and reduces the wavelength shift due to drive currents.

DETAILED DESCRIPTION OF THE INVENTION

Figure 1:
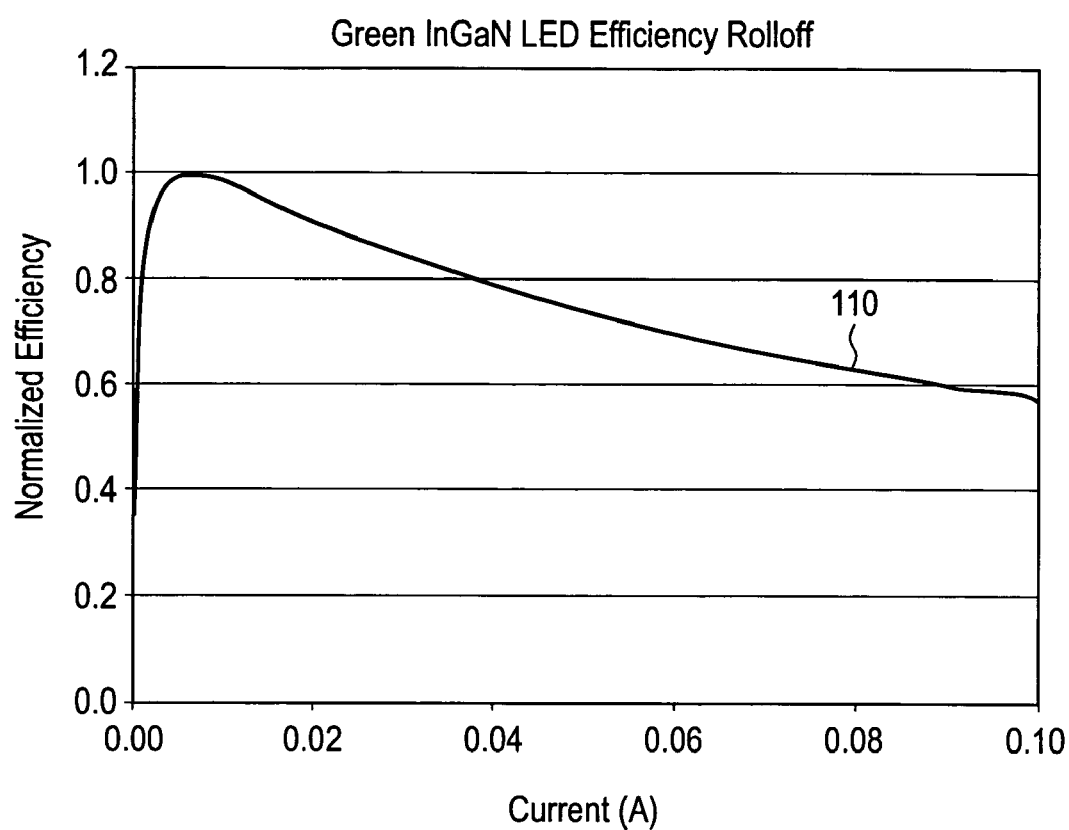
FIG. 1 shows efficiency roll-off versus current.
Figure 2:
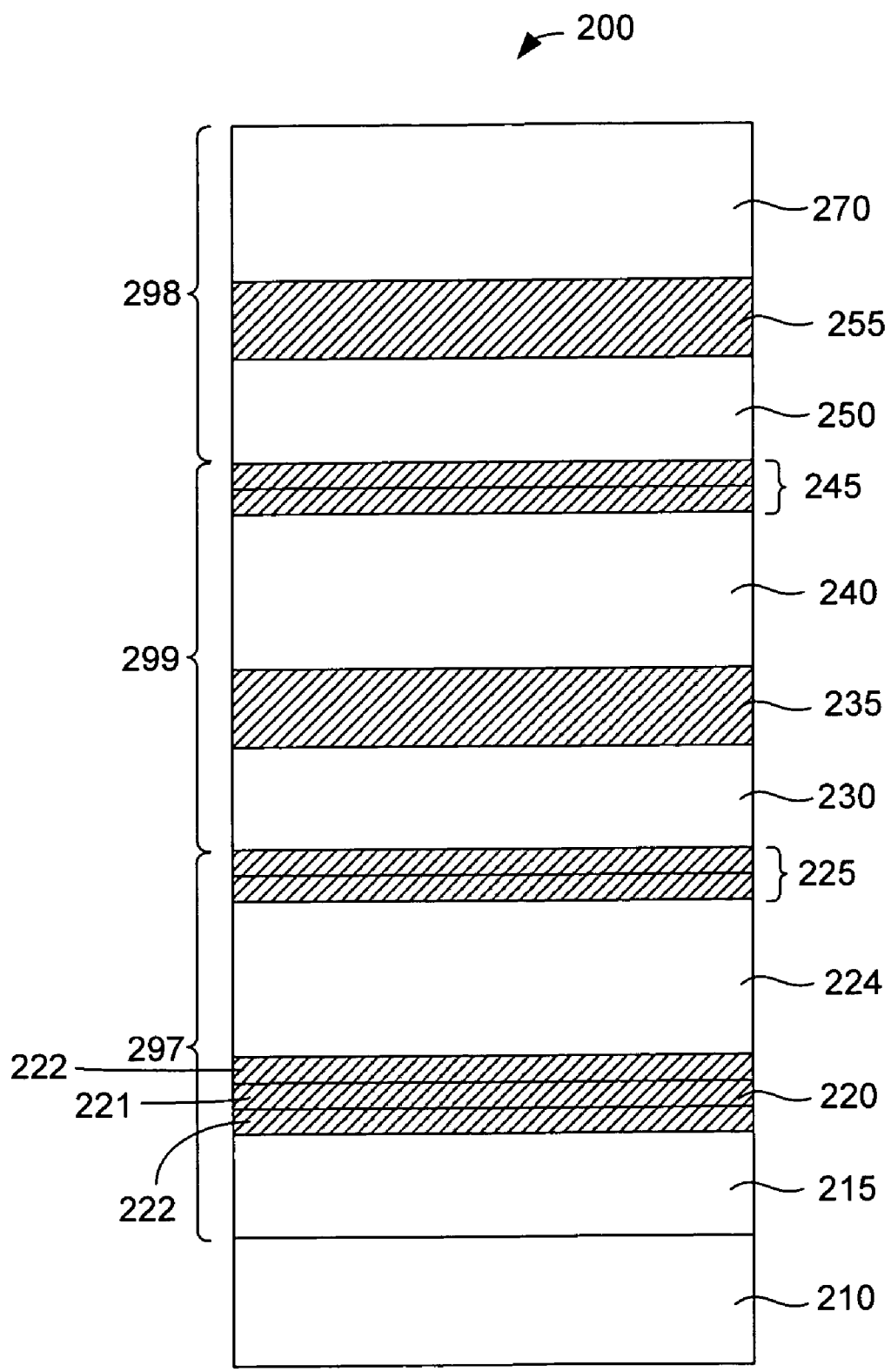
FIG. 2 shows an embodiment in accordance with the invention

FIG. 2 shows LED structure 200 in accordance with the invention. N-type $(Al_xIn_{(1-x)})_yGa_{(1-y)}N$ cladding layer 215 with x=0, y=0 or x=0 is grown to a typical thickness in the range from about 2 μm to about 5 μm on substrate 210 which is typically $Al_2O_3$, SiC, GaN, or AlN. Quantum well active region 220, typically including one to ten InGaN quantum wells 221 and typically separated from one another by GaN barrier layers 222, is grown over AlGaInN cladding layer 215. Growth of quantum well active region 220 is followed by growing p-type AlGaInN cladding layer 224 to a thickness typically in the range from about 0.03 μm to about 0.5 μm thick. Next tunnel junction 225 is formed by growing heavily doped p++ AlGaInN layer 226 to a thickness typically in the range from about 100 to 500 angstroms, followed by growing heavily doped n++ AlGaInN layer 227 to a thickness typically in the range from about 100 to 500 angstroms. P++ AlGaInN layer 226 is heavily p doped, typically with magnesium to a concentration typically in the range from about $6 \cdot 10^{19}/cm^3$ to about $1 \cdot 10^{20}/cm^3$. N++ AlGaInN layer 227 is heavily n doped, typically with silicon to a concentration much greater than $1 \cdot 10^{20}/cm^3$, for example, in the range from about $2 \cdot 10^{20}/cm^3$ to about $3 \cdot 10^{20}/cm^3$. Layer structure 297 comprises n-type AlGaInN cladding layer 215, quantum well active region 220, p-type AlGaInN cladding layer 224 and tunnel junction 225.

Following tunnel junction 225, n-type AlGaInN cladding layer 230 is grown. Then second quantum well active region 235 is grown over n-type AlGaInN cladding layer 230. Second quantum well active region 235 is similar to quantum well active region 220. P-type AlGaInN cladding layer 240 is susbsequently grown over quantum well active region 235. Next tunnel junction 245 is formed by growing p++ AlGaInN layer 246 to a thickness typically in the range from about 100 to 500 angstroms, followed by n++ AlGaInN layer 247 to a thickness typically in the range from about 100 to 500 angstroms. P++ AlGaInN layer 246 is heavily p doped, typically with magnesium to a concentration in the range from about $6 \cdot 10^{19}/cm^3$ to about $1 \cdot 10^{20}/cm^3$. N++ AlGaInN layer 247 is heavily n doped, typically with silicon to a concentration much greater than $1 \cdot 10^{20}/cm^3$, for example, in the range from about $2 \cdot 10^{20}/cm^3$ to about $3 \cdot 10^{20}/cm^3$. Layer structure 299 functions as an LED and is the basic building block for LED structure 200. Layer structure 299 comprises n-type AlGaInN cladding layer 230, quantum well active region 235, p-type AlGaInN cladding layer 240 and tunnel junction 245. Layer structure 299 may be repeated an arbitrary number of times in the vertical stack for LED structure 200, as desired.

Finally, an n-type AlGaInN layer is grown over the last tunnel junction in the vertical stack, for example, n-type AlGaInN cladding layer 250 is grown over tunnel junction 245 for LED structure 200. Quantum well active region 255, similar to quantum well active regions 220 and 235, is then grown over n-type AlGaInN cladding layer 250 and p-type AlGaInN cladding layer 270 is grown over quantum well active region 250. Layer structure 298 comprises n-type AlGaInN cladding layer 250, quantum well active region 255 and p-type AlGaInN cladding layer 270. Layer structure 298 functions as an LED.

Figure 3:
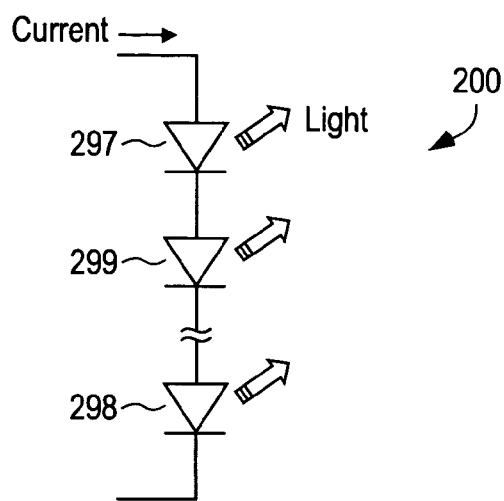
FIG. 3 shows a schematic of an LED structure in accordance with the invention.

Tunnel junctions 245 and 225 in FIG. 2 are reverse biased in the operation of LED structure 200. Reverse biasing tunnel junctions 245 and 255 allows the current to flow through active regions 255, 235 and 220 in series. If there are a total of n quantum well active regions in LED structure 200, an applied voltage V to LED structure 200 will be divided approximately (because of possible parasitic voltage drops across contacts) equally across the n quantum well active regions so that there is a voltage drop of V/n across each layer structure 299 where each layer structure 299 is associated with a quantum well active region. This reduces the current and also the current density by a factor n in each quantum well active region 220, 235 and 255 while increasing the efficiency of LED structure 200. For example, with respect to FIG. 2, three quantum well active regions 220, 235 and 255 are explicitly shown so the voltage drop across each quantum well region 220, 235 and 255 is about one third of the applied voltage, V, with the drive current, I, reduced by a factor of three from the single quantum well region case. FIG. 3 shows a schematic of LED structure 200 indicating that layer structures 297, 299 and 298 function as LEDs. Typically, in an embodiment in accordance with the invention, a total of about two to ten layer structures is used.

Figure 4:
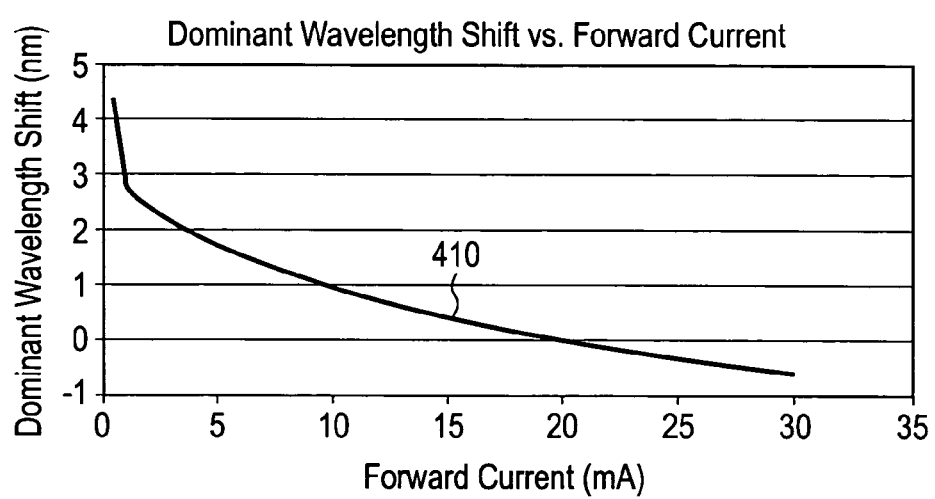
FIG. 4 shows the shows the shift of dominant wavelength with the forward drive current.
Figure 5:
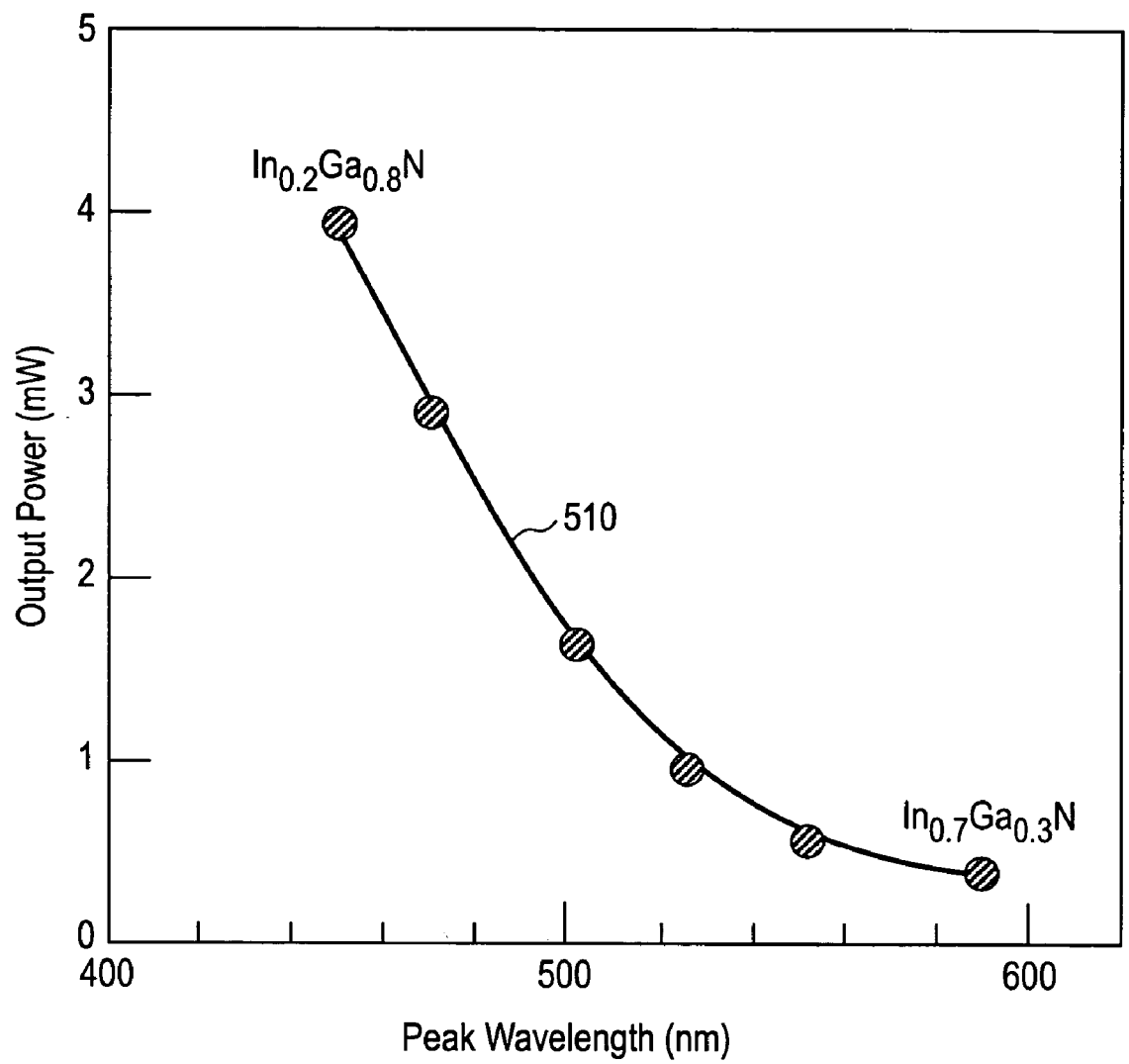
FIG. 5 shows the relative efficiency as a function of wavelength for a constant drive current.

Graph 410 in FIG. 4 shows the shift of dominant wavelength with the forward drive current. For AlGaInN or InGaN LEDs the wavelength typically shifts towards shorter wavelengths as the drive current increases as seen in graph 410. Graph 510 in FIG. 5 shows the relative efficiency as a function of wavelength for a constant drive current of about 20 mA. The relative efficiency improves as the In amount is decreased. To obtain the desired dominant wavelength at the highest forward drive current, quantum well active regions are grown with the appropriate composition of InGa(Al)N. If operation of the LED occurs at less than the highest forward drive current in accordance with the invention, the dominant wavelength will be longer. Hence, a composition with less In is used to obtain the same desired dominant wavelength while improving the efficiency of the LED.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

The invention claimed is:

1. A light emitting diode structure comprising:
   a substrate; and
   a plurality of layer structures formed on said substrate, each one of said plurality of layer structures comprising a tunnel junction and a quantum well active region surrounded by a pair of cladding layers, said plurality of layer structures arranged in a vertical stack with respect to said substrate such that a first one of said plurality of layer structures is closest to said substrate and a second one of said plurality of layer structures is furthest from said substrate.

2. The structure of claim 1 wherein said cladding layer is comprised of AlGaInN.

3. The structure of claim 1 wherein said substrate is comprised of a material selected from the group containing $Al_2O_3$, SiC, AlN, and GaN.

4. The structure of claim 1 wherein said tunnel junction is comprised of an n doped AlGaInN layer.

5. The structure of claim 4 wherein said n doped AlGaInN layer is doped to a concentration in the range from about $2 \cdot 10^{20}/cm^3$ to about $3 \cdot 10^{20}/cm^3$ with an n dopant.

6. The structure of claim 5 wherein said n dopant is silicon.

7. The structure of claim 4 wherein said n doped AlGInN layer has a thickness in the range from about 100 to about 500 angstroms.

8. The structure of claim 1 wherein said tunnel junction is comprised of a p doped AlGaInN layer.

9. The structure of claim 1 wherein said quantum well active region is comprised of a plurality of InGaN quantum wells separated from each other by GaN barrier layers.

10. The structure of claim 1 wherein said tunnel junction is operable to be reverse biased.

11. A method for forming a light emitting diode structure comprising:
    a substrate; and
    forming a plurality of layer structures on said substrate, each one of said plurality of layer structures comprising a tunnel junction and a quantum well active region surrounded by a pair of cladding layers, said plurality of layer structures arranged in a vertical stack with respect to said substrate such that a first one of said plurality of layer structures is closest to said substrate and a second one of said plurality of layer structures is furthest from said substrate.

12. The method of claim 11 wherein said cladding layer is comprised of AlGaInN.

13. The method of claim 11 wherein said substrate is comprised of a material selected from the group containing $Al_2O_3$, SiC and GaN.

14. The method of claim 11 wherein said tunnel junction is comprised of an n doped AlGaInN layer.

15. The method of claim 14 wherein said n doped AlGaInN layer is doped to a concentration in the range from about $2 \cdot 10^{20}/cm^3$ to about $3 \cdot 10^{20}/cm^3$ with an n dopant.

16. The method of claim 15 wherein said n dopant is silicon.

17. The method of claim 14 wherein said n doped AlGaInN layer has a thickness in the range from about 100 to about 500 angstroms.

18. The method of claim 11 wherein said tunnel junction is comprised of a p doped AlGaInN layer.

19. The method of claim 11 wherein said quantum well active region is comprised of a plurality of InGaN quantum wells separated from each other by GaN barrier layers.

20. The method of claim 11 wherein said tunnel junction is operable to be reverse biased.

* * * * *

UNITED STATES PATENT AND TRADEMARK OFFICE
CERTIFICATE OF CORRECTION

| | | |
|---|---|---|
| PATENT NO. | : 7,095,052 B2 | Page 1 of 1 |
| APPLICATION NO. | : 10/971380 | |
| DATED | : August 22, 2006 | |
| INVENTOR(S) | : Steven D. Lester | |

It is certified that error appears in the above-identified patent and that said Letters Patent is hereby corrected as shown below:

Column 3, Line 42, Claim 7, delete "AlGInN" and insert -- AlGaInN --.

Signed and Sealed this

Eighth Day of June, 2010

David J. Kappos
*Director of the United States Patent and Trademark Office*